(12) United States Patent
Kuhn

(10) Patent No.: US 7,786,758 B2
(45) Date of Patent: Aug. 31, 2010

(54) ASYNCHRONOUS CLOCK GATE WITH GLITCH PROTECTION

(75) Inventor: Ruediger Kuhn, Freising (DE)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 12/248,268

(22) Filed: Oct. 9, 2008

(65) Prior Publication Data

US 2009/0096483 A1  Apr. 16, 2009

Related U.S. Application Data

(60) Provisional application No. 61/017,007, filed on Dec. 27, 2007.

(30) Foreign Application Priority Data

Oct. 10, 2007   (DE) ........................ 10 2007 048 646

(51) Int. Cl.
  *H03K 19/00*   (2006.01)
  *H03K 19/02*   (2006.01)
(52) U.S. Cl. .......................................... 326/56; 326/58
(58) Field of Classification Search ............... 326/56–58
  See application file for complete search history.

(56) References Cited

U.S. PATENT DOCUMENTS

| | | | | |
|---|---|---|---|---|
| 5,134,314 A | * | 7/1992 | Wehrmacher | .................. 326/9 |
| 5,535,171 A | * | 7/1996 | Kim et al. | ............... 365/233.14 |
| 5,739,701 A | * | 4/1998 | Oshima | ........................ 326/82 |
| 6,310,494 B1 | | 10/2001 | Ehben et al. | |
| 6,388,467 B1 | * | 5/2002 | Ward et al. | ..................... 326/56 |
| 2001/0026178 A1 | | 10/2001 | Itoh et al. | |
| 2003/0042929 A1 | * | 3/2003 | Kock et al. | ..................... 326/31 |
| 2004/0257110 A1 | * | 12/2004 | Mitarashi | ..................... 326/56 |

FOREIGN PATENT DOCUMENTS

| | | |
|---|---|---|
| DE | 198 03 757 A1 | 8/1999 |
| DE | 101 42 679 A1 | 4/2003 |

\* cited by examiner

*Primary Examiner*—James H. Cho
*Assistant Examiner*—Matthew C Tabler
(74) *Attorney, Agent, or Firm*—Robert D. Marshall, Jr.; W. James Brady; Frederick J. Telecky, Jr.

(57) ABSTRACT

A tristate buffer circuit includes a tristate buffer switchable into a high impedance state in response to configuration signal, a delay stage delays the an input signal to the tristate buffer and a gating stage having inputs for the input signal, a delayed input signal and an asynchronous tristate control signal and an output supplying the configuration signal to the tristate buffer. The gating stage sets the configuration signal to the high impedance mode only when the tristate control signal is set and the input signal and the delayed input signal have logic levels indicating that no signal transition of the input signal propagates within the delay stage. Depending upon signal polarity, the input signal and the delayed input signal are required to have the same digital state or opposite digital states.

6 Claims, 4 Drawing Sheets

ASYNCHRONOUS CLOCK GATE WITH GLITCH PROTECTION

CLAIM OF PRIORITY

This application claims priority under 35 U.S.C. 119(a) to German Patent Application No. 10 2007 048 646.6 filed Oct. 10, 2007 and under 35 U.S.C. 119(e)(1) to U.S. Provisional Application No. 61/017,007 filed Dec. 27, 2007.

TECHNICAL FIELD OF THE INVENTION

The technical field of this invention is tristate buffers which can be switched into a high impedance state in response to a first configuration signal. More specifically, the technical field of this is a signal buffering device with a high impedance output state for holding a signal level adapted to avoid glitches in a buffered output signal.

BACKGROUND OF THE INVENTION

Tristate buffers are typically used for buffering clock signals in integrated electronic devices. Tristate buffers can be switched into a high impedance state in order to hold the clock in the electronic device or to allow another buffer to take over control of a clock line. If the clock is switched synchronously, then the clock can be only switched at an appropriate moments with a safety margin from the falling or rising edges of the clock signal. For asynchronous systems, a tristate signal effectively switching the buffered clock signal off can occur at any time within a clock period. If the tristate buffer is switched off or on coincidentally with an edge of the clock signal, a glitch can occur. A glitch can still trigger some of the clocked components coupled to the tristate buffer output. Others components may not be clocked correctly. Glitches thus typically risk malfunctions and should be avoided.

SUMMARY OF THE INVENTION

It is an object of the present invention to provide an electronic device with a tristate buffer which is adapted to prevent glitches at the tristate buffer output.

Accordingly, the present invention includes a tristate buffer to be switched into a high impedance state in response to a first configuration signal. The circuitry further includes a regenerative loop coupled to an output of the tristate buffer to maintain an output signal of the tristate buffer when the tristate buffer is switched into the high impedance state. An input delay stage delays the input signal to the tristate buffer. A gating stage receives the input signal, a delayed version of the input signal from the delay stage and an asynchronous tristate signal controlling switching to the high impedance state. The gating stage output is coupled to the tristate buffer providing a first configuration signal. The gating stage is further adapted to set the first configuration signal only when the tristate signal is set and the input signal and the delayed signal have logic levels indicating that no signal transition of the input signal propagates within the delay stage. The delayed signal can preferably be the output signal of the tristate buffer.

A signal is input to the circuit and is delayed by the delay stage. The delayed input signal is then buffered by the tristate buffer to produce an output signal. The gating stage receives the input signal and a delayed signal, which can be an output signal of the delay stage or the output signal of the tristate buffer. When the tristate buffer is to be switched into a high impedance state, the gating stage receives a tristate signal. Only when the tristate signal is received at the gating stage, and also when both the input signal and delayed signal have logic levels indicating that no signal transition of the input signal is propagating in the delay stage, does the gating stage output the first configuration signal to the tristate buffer that switches it into a high impedance state. Practically, a transition propagating through the delay stage can be detected by equal or different logic levels of the input signal and the delayed signal. The delayed signal may preferably be the output signal of the tristate buffer, but may be a delayed version of the input signal at the output of the delay stage. While the tristate buffer is being switched into the high impedance state, the regenerative loop connected to the output of the tristate buffer holds the output signal. In other words, the logic level of the output signal is maintained by the regenerative loop when the buffer goes into tristate. Gating the first configuration signal in this way and using the delay stage moves any possible glitch generation out of the signal path. The switching of the tristate buffer has a temporary advance with respect to the input signal due to the delay stage. If the amount of delay is carefully chosen, any transition or edge of the input signal can be prevented from passing through the tristate buffer when switching the tristate buffer into high impedance mode. Furthermore, the present invention is a simple circuit, requires only a small area and consumes only a small amount of power.

Preferably, the input signal is a clock signal and the delay stage has a delay which is shorter than half a clock period. The delay stage thus delays the input signal by an amount shorter than half a clock period of the input signal. Theoretically, the delay should be longer than $(2nT)/2$ and shorter than $(2n+1)T/2$, where: T is the clock period of the input clock signal; and n is an integer with $n \geq 0$. The tristate signal is asynchronous with the input signal. If the tristate signal is gated with the input signal and the delayed signal, a delay of less than half a clock period avoids glitches during the transition into the high impedance mode of the tristate buffer. Thus no glitches can occur in the buffer output signal due to a switch into the high impedance state coinciding with a transition in the input (clock) signal.

The delay stage can be a chain of a plurality of inverters. The inverters forming the delay stage can be connected in series between the input and the tristate buffer. Each inverter may be formed from a complementary pair of MOS transistors. This simplifies circuit design and permitting use of existing design libraries.

The gating stage preferably includes a latch set only if the tristate signal is set and the input signal and the output signal have the relevant logic levels. This can be the same levels or different levels dependent on the specific implementation. An example of the present invention is described hereinbelow using the same logic levels of the two signals. However, it is evident to a person skilled in the art that an inversion can be used to base the further operation on different logic levels of output and input signals. When employing the same logic levels, the latch is set so that the gating stage outputs the first configuration signal only when it receives the tristate signal and the input and output signals have the same logic levels.

The present invention is also a method for operating a tristate buffer. The input to the tristate buffer is delayed. When an asynchronous tristate signal indicating switch the tristate buffer into a high impedance state is received, the logic level of the delayed input signal is compared with the logic level of the input signal. The tristate buffer may only switched into the high impedance state, when one of the following two conditions is met: either the input signal and the delayed input signal have the same levels; or the input and the delayed input signal have different levels. The choice of the condition depends on the number of inverters used. The two signals having either the same logic levels or different logic levels may indicate that no signal transition is pending. Generally, delaying the input signal enables avoiding signal transitions of the tristate buffer input signal into the hold or high impedance mode. The command or request to set the tristate buffer into hold mode must be gated with the input signal and a delayed version of the input signal. This delayed version of the input signal can either be the output signal of the tristate buffer or the delayed input signal to the tristate buffer.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
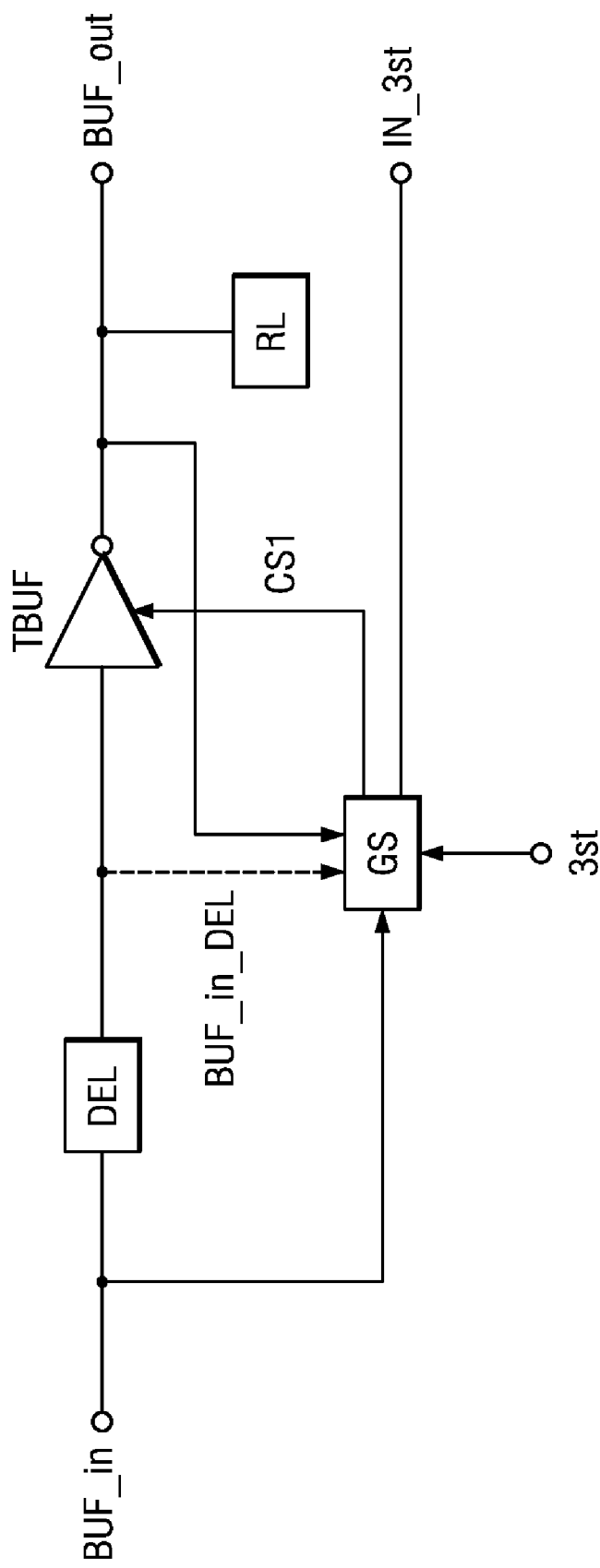
FIG. 1 is a simplified schematic of a circuit including a tristate buffer according to one embodiment of the invention.

Figure 1 illustrates a circuit of this invention having an input node receiving input signal BUF_IN which may be a clock signal. The input node is coupled to the input of delay stage DEL and one input of gating stage GS. Delay stage DEL outputs a delayed input signal BUF_IN_DEL. This delayed input signal BUF_IN_DEL feeds the input of tristate buffer TBUF. Tristate buffer TBUT generates an output signal BUF_OUT. This output signal is retained by regenerative loop RL. Gating stage GS forms a regenerative loop connected to tristate buffer TBUF. Gating stage GS has a first input receiving the input signal BUF_IN. Gating stage GS has a second input receiving the output of the tristate buffer TBUF, which is delayed input signal BUF_IN$_{13}$ DEL after buffering by tristate buffer TBUF. Gating stage GS has a further input receiving a tristate signal 3ST which is an external signal requesting the buffer to go into tristate. A first output of gating stage GS supplies configuration signal CS1 controlling tristate buffer TBUF entry into a high impedance state. A second output of gating stage GS supplies the signal IN$_{13}$ 3ST which indicates successfully entry into the high impedance state (tristate).

Table 1 lists the logic levels of the input signal BUF_IN, output signal BUF_OUT, tristate signal 3ST and configuration signal CS1 during operation of the device shown in FIG. 1.

TABLE 1

| BUF_IN | BUF_OUT | 3ST | CS1 |
|---|---|---|---|
| 0 | 0 | 0 | 0 |
| 0 | 1 | 0 | 0 |
| 1 | 0 | 0 | 0 |
| 1 | 1 | 0 | 0 |
| 0 | 0 | 1 | 1 |
| 0 | 1 | 1 | 0 |
| 1 | 0 | 1 | 0 |
| 1 | 1 | 1 | 1 |

If the configuration signal CS1 is at logic 1, buffer TBUF is set into the high impedance state. This occurs only when buffer input BUF_IN and buffer output BUF_OUT have the same state, either both logic 0 or both logic 1. If 3ST is logic 1, a request is pending to set buffer TBUF into high impedance state. If 3ST is logic 0, the configuration signal CS1 will remain at logic 0. Gating stage GS generates the appropriate configuration signal CS1 in response to 3ST, BUF_IN and BUF_OUT. If the tristate signal 3ST is logic 1 and both the input signal BUF_IN and the output signal BUF_OUT are at logic 1, then gating stage GS sets configuration signal CS1 to logic 1. The same situation occurs when BUF_OUT and BUF_IN are both logic 0. When BUF_IN and BUF_OUT are at the same state, then no signal transition of BUF_IN is propagating within delay stage DEL and within the tristate TBUF. When gating stage GS generates configuration signal CS1 at logic 1, tristate buffer TBUF switches into a high impedance state. When BUF_IN is at logic 0 and BUF_OUT is at logic 1 and vice versa, then a signal transition of BUF_IN is propagating within delay stage DEL or within buffer TBUF. Therefore if gating stage GS detects either of these two logic states, it will not generate a logic 1 configuration signal CS1 even if tristate signal 3ST is at logic 1. The configuration signal CS1 will be logic 0 even if the tristate signal 3ST is at logic 1. Since tristate buffer TBUF will not be switched into a high impedance state unless there is no signal transition of input signal BUF_IN propagating within delay stage DEL, glitches in the output signal BUF_OUT are avoided. A signal transition of BUF_IN, can only occur at tristate buffer TBUF after the delay time of delay stage DEL. Therefore, the buffer of this invention will not generate glitches when switching into the high impedance state.

Glitches during the asynchronous tristate action are not completely removed from the system of this invention. The point of potential glitch generation is moved out of the signal path. A glitch can be generated if a tristate request coincides with the transition of the signal CAN__3ST. However, this glitch is not in the signal path but at the input of a latch which generates the first configuration signal CS1. This glitch may be long enough to set the latch or it may be too short to set it. In both cases it will not result in a glitch in the output signal since the delay and detection circuit ensures that a transition of the input signal is not propagating through the tristate buffer at this point in time.

Because gating stage GS is not in the direct signal path but in parallel with the delay stage DEL and the tristate buffer TBUF, any glitches in the tristate signal 3ST applied to gating stage GS will also be passed to the output signal BUF_OUT. Regenerative loop RL holds output signal BUF_OUT while tristate buffer TBUF switches into its high impedance or tristate mode. The configuration signal and the switching of tristate buffer TBUF has an advance long enough due to the delay stage DEL to avoid a glitch upon a transition of input signal BUF_IN. The critical timing and resulting glitches are moved out of the signal path. This will be explained in further detail with respect to FIGS. 3 and 4.

An alternative embodiment uses delayed signal BUF_IN_DEL instead of BUF_OUT. This is indicated in FIG. 1 by a dashed line from delay stage DEL to gating stage GS. This alternative embodiment may be a little less reliable, but with appropriate selection of the delay of delay stage DEL the general function will remain the same. In this alternative embodiment BUF_IN_DEL replaces BUF_OUT in Table 1. The corresponding explanations regarding BUF_OUT apply to BUF_IN_DEL.

Figure 2:
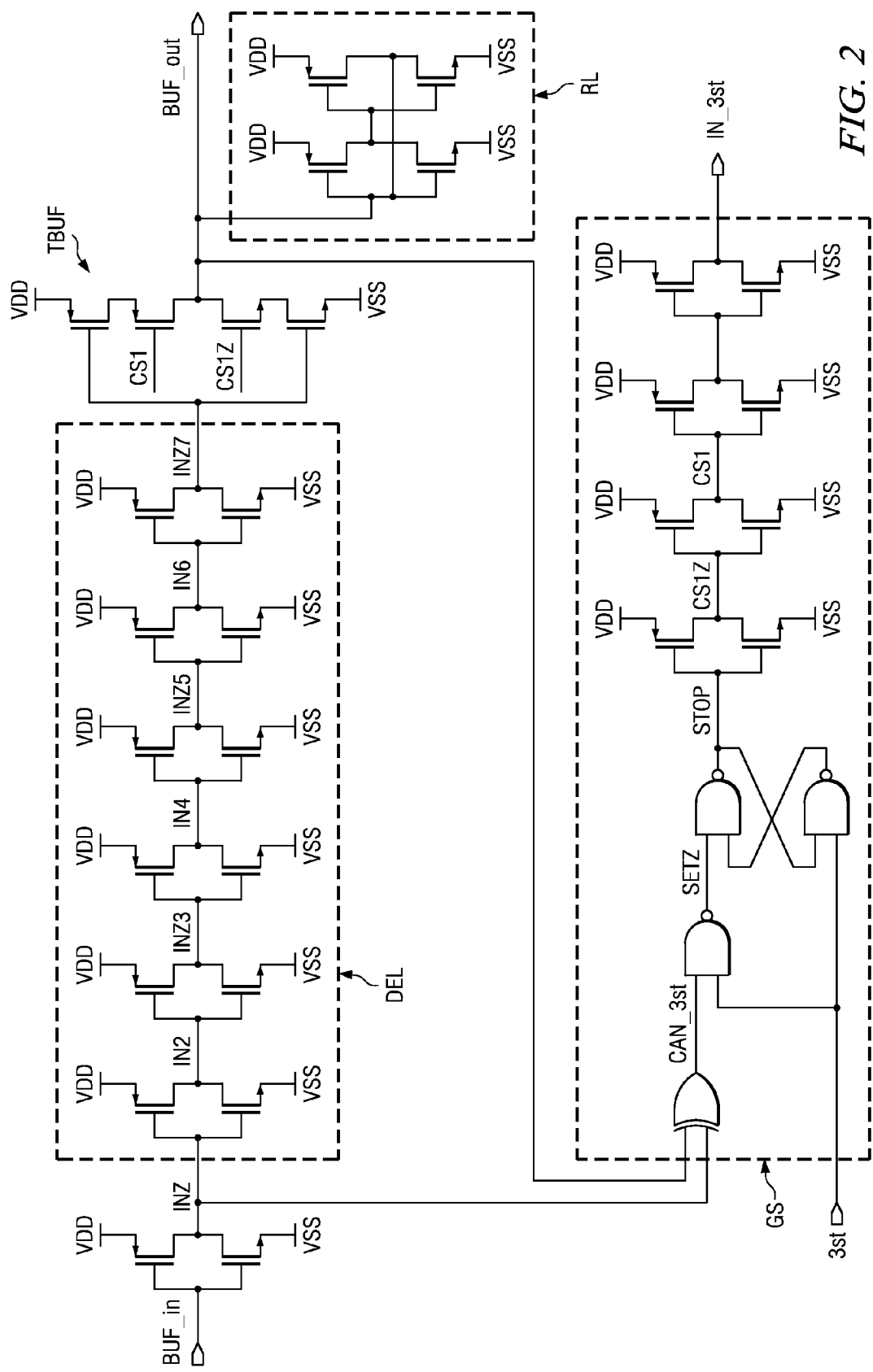
FIG. 2 is a simplified circuit diagram of a circuit including a tristate buffer according to a second, preferred embodiment of the invention.

FIG. 2 shows a preferred embodiment of the invention that operates similar to the embodiment shown in FIG. 1. FIG. 2 illustrates delay stage DEL as a chain of inverters. Each of inverters is as a complementary pair of MOS transistors connected between the positive and negative supply voltages VDD and VSS, respectively. The input to delay stage DEL is INZ, an inverted version of BUF_IN. A first inverter of delay stage DEL produces a signal IN2, a second inverter produces a signal INZ3, a third inverter produces a signal IN4, a fourth inverter produces a signal INZ5, a fifth inverter produces a signal IN6 and a sixth inverter produces a signal INZ7. Tristate buffer TBUF includes two PMOS and two NMOS transistors connected in series between the positive supply voltage VDD and the negative supply voltage VSS. One NMOS transistor and one of PMOS transistor have their gate terminals interconnected and receive INZ7 the output of delay stage DEL. The gate terminals of the other PMOS and NMOS transistors in tristate buffer TBUF are the inputs of tristate buffer TBUF. These gates receive complementary configuration signals CS1 and CS1Z gated by gating stage GS. The output of tristate buffer TBUF, the signal BUF_OUT, is formed at the interconnection of drain terminals of the central complementary pair of MOS transistors in the series connection. Regenerative loop RL has two pairs of complementary MOS transistors connected in series as a latch. Gating stage GS includes an input XOR gate connected in series with a NAND gate, a pair of cross-coupled NAND gates which form a latch and a chain of plural inverters formed of complementary MOS transistor pairs. The XOR gate the input signal BUF_IN at one input and output signal BUF_OUT at another input. The XOR gate outputs a signal CAN_3ST to one input of the first NAND gate. The other input of the first NAND gate is tristate signal 3ST. The first NAND gate generates an output signal SETZ which supplied to one input of one of the cross-coupled NAND gates. Tristate signal 3ST is supplied to an input of the other of the cross-coupled NAND gates. If SETZ is low at logic 0, the latch is set and the output of the latch STOP becomes logic 1. Otherwise, STOP is logic 0. Signal STOP supplies the input of the chain of inverters. The inverter chain output is tristate indication signal IN_3ST. IN_3ST can be used as flag indicating that tristate buffer TBUF has been successfully set into a high impedance state. The first configuration signal CS1 is generated at the output of a first inverter in the chain and the complementary configuration signal CS1Z is generated at the output of a second inverter in the chain.

Table 2 lists the relative logic states of the signals shown in FIG. 2. The inputs of the XOR gate in gating stage GS span an odd number of inverters in the delay chain forming delay stage DEL. One input of the XOR gate receives the inverted input signal BUF_IN. Where there is no transition in delay stage DEL and thus the inputs of the XOR gate are equal, the output signal CAN_3ST of the XOR gate is logic 1. As long as CAN_3ST is logic 1 and 3ST is not set and thus at logic 0, the output of the NAND gate SETZ remains at logic 1. With no signal transition in delay stage DEL, the inputs of the XOR gate have the same state and the signal CAN_3ST is at logic 0. The signal CAN_3ST output from the XOR gate serves as a gating signal for the asynchronous tristate signal 3ST, which can set the NAND gate latch. Whenever a transition passes through delay stage DEL and tristate buffer TBUF, tristate signal 3ST is gated so that the signal SETZ is at logic 1. As a result, the configuration signal CS1 remains at logic 0 and tristate buffer TBUF cannot be switched into a high impedance state. This avoids generation of a glitch at the output. However, if no transition occurs in delay stage DEL and tristate buffer TBUF and thus CAN_3ST is logic 1 and 3ST is at logic 1, setting signal SETZ changes to logic 0. Having 3ST at logic 1 and SETZ at logic 0 as inputs, the NAND gate latch is set and output STOP from logic 0 to logic 1. As a consequence, signal CS1Z changes to logic 0 and signal CS1 changes to logic 1. Tristate buffer TBUF is thus set to high impedance.

TABLE 2

| IN_BUF | OUT_BUF | CAN_3ST | 3ST | SETZ | CS1 |
|--------|---------|---------|-----|------|-----|
| 1 | 0 | 0 | 0 | 1 | 0 |
| 0 | 1 | 0 | 0 | 1 | 0 |
| 1 | 1 | 1 | 0 | 1 | 0 |
| 0 | 0 | 1 | 0 | 1 | 0 |
| 1 | 0 | 0 | 1 | 1 | 0 |
| 0 | 1 | 0 | 1 | 1 | 0 |
| 1 | 1 | 1 | 1 | 0 | 1 |
| 0 | 0 | 1 | 1 | 0 | 1 |

Note in FIG. 2 the relationship between the input signal (BUF_IN) and the delayed input signal (BUF_IN_DEL, BUF_OUT) indicating no signal transition is the same logic levels. This is because delay stage (DEL) includes an even number of inverters. If delay stage (DEL) included an odd number of inverters, the relationship indicating no signal transition would be opposite logic levels.

Figure 3:
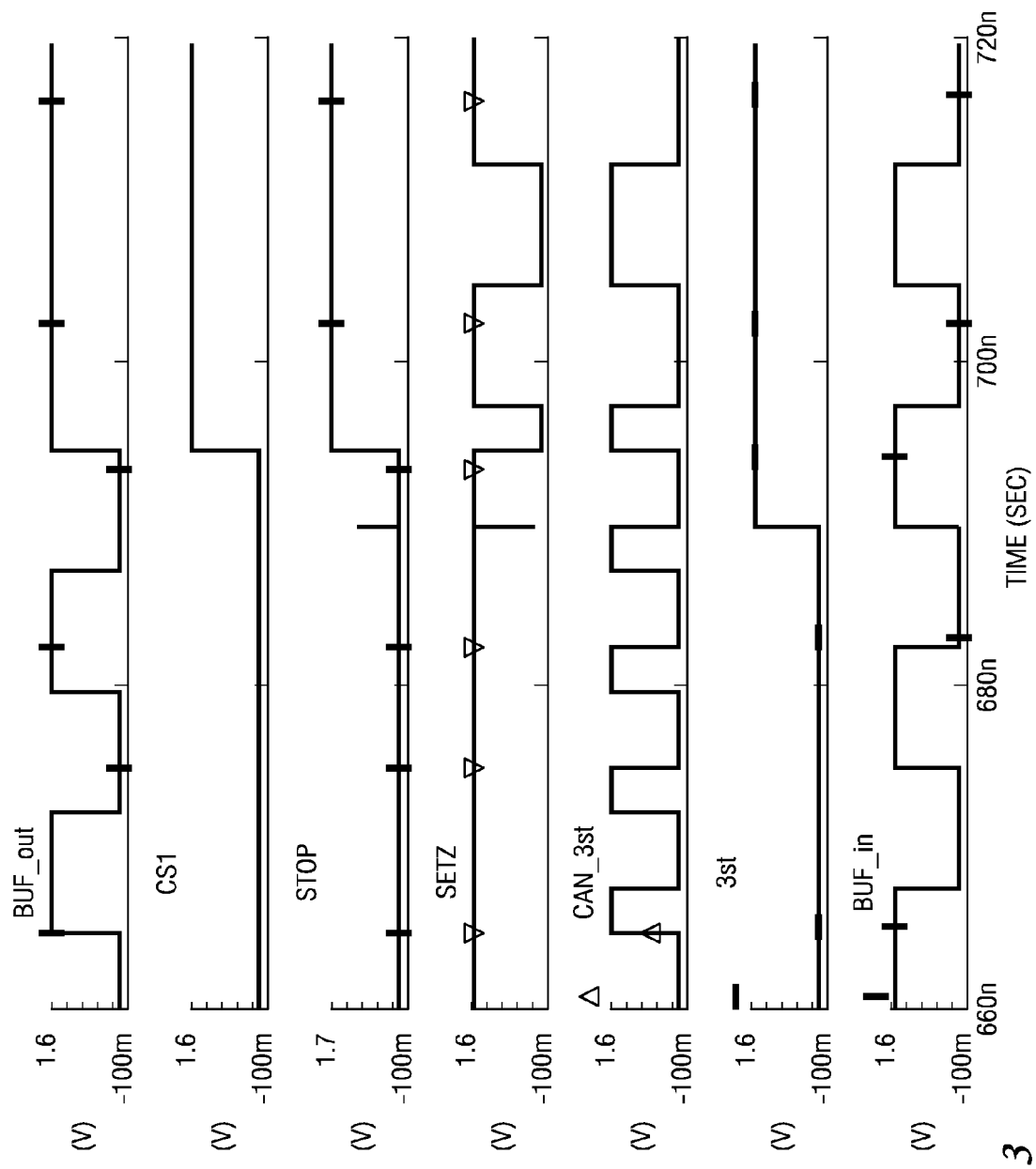
FIG. 3 is a timing diagram of clock signal transitions in a circuit including a tristate buffer according to the invention for a small glitch on the tristate signal.
Figure 4:
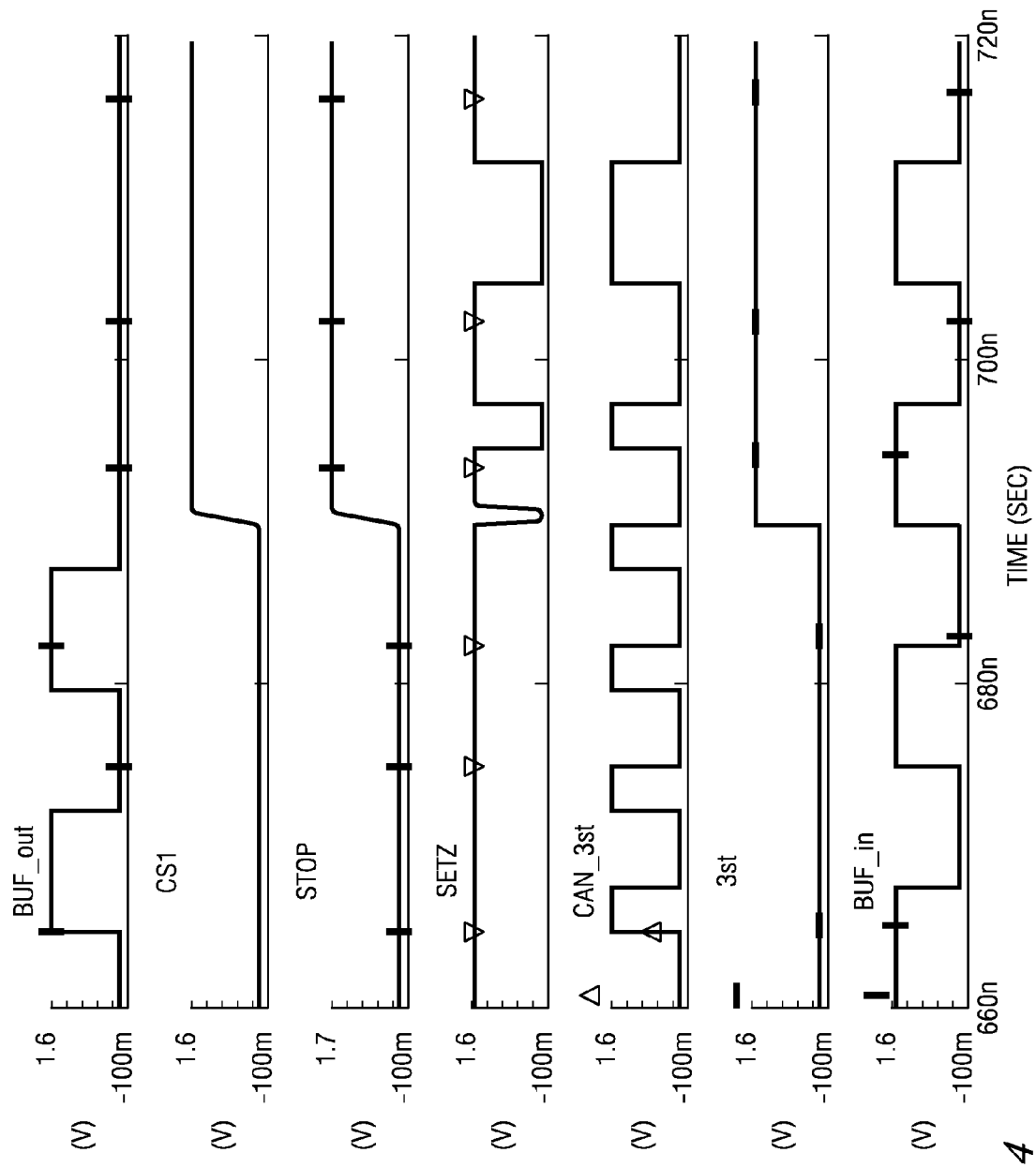
FIG. 4 is a timing diagram of clock signal transitions in a circuit including a tristate buffer according to the invention for a larger glitch on the tristate signal.

Operation of this invention will now be described in conjunction with the waveforms illustrated in FIGS. 3 and 4. FIGS. 3 and 4 illustrate input signal BUF_IN, tristate signal 3ST, the output of the XOR gate signal CAN_3ST, the output of the NAND gate SETZ, the output of the NAND gate latch STOP, the control signal CS1 and the tristate buffer output signal BUF_OUT. In FIG. 3 the transition requesting a tristate of buffer TBUF in tristate signal 3ST coincides with a state transition in the input signal BUF_IN. This coincidence results in a short pulse of the signal SETZ output from the NAND gate. FIG. 3 illustrates that this pulse or glitch of SETZ is too short and the NAND gate latch does not flip over. Any a glitch in signal STOP input to the inverter chain in gating stage GS has no effect since the tristate buffer output signal BUF_OUT which is stable at logic 0 or logic 1.

In FIG. 4 the transition requesting a tristate of buffer TBUF in tristate signal 3ST lags the state transition in the input signal BUF_IN. As a result the pulse in signal SETZ is wider as illustrated in FIG. 4. If the pulse is wide enough, the NAND gate latch will trigger and STOP changes to logic 1. Due to delay stage DEL, the next clock transition in tristate buffer TBUF is still underway in the delay chain. Thus tristate buffer TBUF is switched at a point of time which has sufficient distance to the next edge of the delayed input signal IN_BUF. Thus the output signal BUF_OUT does not have a glitch in this situation.

Although the present invention has been described hereinabove with reference to specific embodiments, it is not limited to this embodiment and no doubt further alternatives will occur to the skilled person that lie within the scope of the invention as claimed.

What is claimed is:

1. A tristate buffer circuit operable to be switched into a high impedance state in response to a first configuration signal (CSI) comprising:

a tristate buffer (TBUF) having an input, an output and a tristate control input, said tristate buffer (TBUF) outputting a signal (BUF OUT) corresponding to said signal on said input in a normal mode and outputting a high impedance signal in a high impedance mode as controlled by said tristate control input;

a delay stage (DEL) having a input receiving an input signal (BUF IN) and an output connected to said input of said tristate buffer (TBUF) for delaying said input signal (BUF IN);

a gating stage (GS) having inputs receiving said input signal (BUF IN), a delayed signal (BUF IN DEL, BUF OUT) by said delay stage (DEL) and an asynchronous tristate signal (3ST) indicating that the buffer (TBUF) is to be switched into the high impedance state, and an output connected to said tristate control input of said tristate buffer (TBUF) providing a configuration signal (CSI), said gating stage (GS) operable to set said configuration signal (CSI) to select said high impedance mode only when said tristate signal (3ST) is set and said input signal (BUF IN) and said delayed signal (BUF IN DEL, BUF OUT) have the same logic levels indicating that no signal transition of said input signal (BUF IN) propagates within said delay stage (DEL);

wherein said gating stage (GS) includes a latch, which is only set if said tristate signal (3ST) is set and said input signal (BUF IN) and said output signal (BUF OUT) have the same logic levels.

2. The tristate buffer circuit according to claim 1, wherein:
said input signal (BUF IN) is a clock signal; and
said delay stage (DEL) has a delay less than half a clock period of said clock signal.

3. The tristate buffer circuit according to claim 1, wherein:
said input signal (BUF IN) is a clock signal having a period T; and
said delay stage (DEL) has a delay longer than $(2nT)/2$ and shorter than $(2n+1)T/2$, where n is an integer with $n \geq 0$.

4. The tristate buffer circuit according to claim 1, further comprising:
a regenerative loop (RL) coupled to said output of said tristate buffer (TBUF) maintaining said output signal (BUF OUT) when said tristate buffer (TBUF) is switched into said high impedance mode.

5. The tristate buffer circuit according to claim 1, wherein:
said delayed input signal consists of an output (BUF IN DEL) of said delay stage (DEL).

6. The tristate buffer circuit according to claim 1, wherein:
said delayed input signal consists of said output (BUF OUT) of said tristate buffer (TBUF).

* * * * *